(12) United States Patent
Braun et al.

(10) Patent No.: US 7,200,033 B2
(45) Date of Patent: Apr. 3, 2007

(54) MRAM WITH COIL FOR CREATING OFFSET FIELD

(75) Inventors: Daniel Braun, Paris (FR); Dietmar Gogl, Essex Junction, VT (US)

(73) Assignees: Altis Semiconductor, Corbeil Essonnes (FR); Infineon Technologies AG, Munich (DE)

( * ) Notice: Subject to any disclaimer, the term of this patent is extended or adjusted under 35 U.S.C. 154(b) by 110 days.

(21) Appl. No.: 10/998,808

(22) Filed: Nov. 30, 2004

(65) Prior Publication Data
US 2006/0114713 A1  Jun. 1, 2006

(51) Int. Cl.
G11C 11/00 (2006.01)
G11C 5/06 (2006.01)
G11C 11/14 (2006.01)
G11C 11/15 (2006.01)
G11C 7/02 (2006.01)

(52) U.S. Cl. .................. 365/158; 365/66; 365/171; 365/172; 365/173; 365/208

(58) Field of Classification Search .................. 365/66, 365/158, 171, 172, 173, 209, 154
See application file for complete search history.

(56) References Cited

U.S. PATENT DOCUMENTS

| | | | |
|---|---|---|---|
| 4,972,369 A * | 11/1990 | Akiba et al. ................. 365/2 |
| 6,166,948 A | 12/2000 | Parkin et al. | |
| 6,531,723 B1 | 3/2003 | Engel et al. | |
| 6,545,906 B1 | 4/2003 | Savtchenko et al. | |
| 6,950,369 B2 | 9/2005 | Kunikiyo et al. | |
| 2001/0025978 A1 | 10/2001 | Nakao | |
| 2002/0176277 A1 | 11/2002 | Bessho et al. | |
| 2003/0218903 A1 * | 11/2003 | Luo ........................ 365/158 |
| 2004/0046017 A1 * | 3/2004 | Sueyoshi et al. ........... 235/382 |
| 2004/0066668 A1 | 4/2004 | Gider et al. | |
| 2004/0196681 A1 * | 10/2004 | Xiao et al. ................. 365/145 |
| 2005/0093669 A1 * | 5/2005 | Ahn et al. ................. 336/200 |

FOREIGN PATENT DOCUMENTS

WO  WO 03/092011 A2  11/2003

* cited by examiner

Primary Examiner—Ly D. Pham
(74) Attorney, Agent, or Firm—Edell, Shapiro & Finnan, LLC

(57) ABSTRACT

An MRAM memory chip includes a plurality of magnetoresistive memory cells each including a magnetic tunnel junction having first (fixed) and second (free) magnetic regions, where the second magnetic region includes at least two ferromagnetic layers that are antiferromagnetically coupled, wherein a coil surrounds the memory chip for creating a magnetic offset field. Further, a method of writing to an MRAM chip includes bringing the memory cells into an active state exhibiting a reduced switching field before writing thereto and bringing the memory cells into a passive state exhibiting enlarged switching field after writing thereto.

4 Claims, 3 Drawing Sheets

MRAM WITH COIL FOR CREATING OFFSET FIELD

FIELD OF THE INVENTION

The present invention is in the field of non-volatile semiconductor memory chips.

BACKGROUND

Magnetic (or magnetoresistive) random access memory (MRAM) is a non-volatile access memory technology that could potentially replace the dynamic random access memory (DRAM) as the standard memory for computing devices. A magnetic memory cell (also referred to as a tunneling magnetoresistive or TMR-device) includes a structure having ferromagnetic layers respectively provided with a resultant magnetic moment vector and separated by a non-magnetic layer (tunnel barrier) and arranged into a magnetic tunnel junction (MTJ). Digital information is stored and represented in the magnetic memory cell as directions of magnetic moment vectors in the ferromagnetic layers. More specifically, the resultant magnetic moment vector of one ferromagnetic layer is magnetically fixed or pinned (conveniently also referred to as "reference layer" or "pinned layer"), while the resultant magnetic moment vector of the other ferromagnetic layer (conveniently also referred to as "free layer") is free to be switched between two preferred directions, i.e., the same and opposite directions with respect to the fixed magnetization direction of the reference layer. The orientations of the magnetic moment vector of the free layer are also known as "parallel" and "antiparallel" states, respectively, wherein a parallel state refers to the same magnetic alignment of the free and reference layers, while an antiparallel state refers to opposing magnetic alignments therebetween. Accordingly, a memory state of a magnetic memory cell is not maintained by power as in DRAMs, but rather by the direction of the magnetic moment vector of the free layer with respect to the direction of the magnetic moment vector of the reference layer.

Depending upon the magnetic states of the free layer (i.e., parallel or antiparallel states), the magnetic memory cell exhibits two different resistance values in response to a voltage applied across the magnetic tunnel junction barrier. The particular resistance of the TMR-device thus reflects the magnetization state of the free layer, wherein the resistance is "low" when the magnetization is parallel, and "high" when the magnetization is antiparallel. Accordingly, detecting changes in resistance allows an MRAM device to provide information stored in the magnetic memory element, i.e., to read information from the magnetic memory cell. In addition, a magnetic memory cell is written to through the application of bi- or uni-directional currents in order to magnetically align the free layer in a parallel or antiparallel state.

An MRAM chip typically integrates a plurality of magnetic memory cells and other circuits, such as a control circuit for magnetic memory cells, comparators for detecting states in a magnetic memory cell, input/output circuits and miscellaneous support circuitry. Conveniently, magnetic memory cells are designed to be integrated into the back end wiring structure of back-end-of-line (BEOL) CMOS processing following front-end-of-line (FEOL) CMOS processing.

To be useful in present day electronic devices, very high density arrays of magnetic memory cells are utilized in magnetic random access memory devices. In these high density arrays, the magnetic cells are generally arranged in rows and columns, with individual cells being addressable for reading and writing operations by the selection of an appropriate row and column containing the desired cell. Also, conveniently orthogonal current lines are provided, one for each row and one for each column so that a selected cell is written by applying current to the appropriate row current line and the appropriate column current line.

In such typical MRAM cells, if a magnetic field having at least a vector component in the direction opposite to the magnetization direction of the free layer is applied, then the magnetic moment vector of the free layer is reversed at a critical magnetic field value, which is also referred to as reversal magnetic field. The value of the reversal magnetic field can be determined from a minimum energy condition. Assuming that a magnetic field applied to the direction of the hard axis of magnetization is represented by $H_x$ and a magnetic field applied to the direction of the easy axis of magnetization is represented by $H_y$, then a relationship $H_x^{(2/3)} + H_y^{(2/3)} = H_c^{(2/3)}$ is established, where $H_c$ represents the anisotropic magnetic field of the free layer. Since this curve forms an astroid on the $H_x$-$H_y$-plane, it is called astroid curve. Based on above equation, a typical switching mechanism used for switching MRAM cells is the "Stoner-Wohlfahrt"-switching scenario, well-known to those skilled in the art.

In recent years, a new concept of magnetoresistive tunneling junction memory cells has been proposed, wherein the free layer is designed to be a free magnetic region including a number of ferromagnetic layers that are antiferromagnetically coupled, where the number of antiferromagnetically coupled ferromagnetic layers may be appropriately chosen to increase the effective magnetic switching volume of the MRAM device. See, for instance, U.S. Pat. No. 6,531,723 B1 to Engel et al., the disclosure of which is incorporated herein by reference.

For switching of such magnetoresistive memory cells having a free magnetic region including antiferromagnetically coupled ferromagnetic layers, another switching scenario, the so-called "adiabatic rotational switching", which is well-known to the skilled persons, is envisaged. The adiabatic rotational switching mechanism is, for example, disclosed in U.S. Pat. No. 6,545,906 B1 to Savtchenko et al., the disclosure of which is incorporated herein by reference.

One major difference between convenient Stoner-Wohlfarth-switching and adiabatic rotational switching is given by the fact that the latter one typically uses only unidirectional currents applied to bit and word lines for switching of the resultant magnetic moment vector of the free magnetic region. More specifically, adiabatic rotational switching relies on the "spin-flop" phenomenon, which lowers the total magnetic energy in an applied magnetic field by rotating the magnetic moment vectors of the magnetic free region ferromagnetic layers.

Referring to FIG. 1, a typical stability diagram for an adiabatic rotation switchable MRAM cell is illustrated, the abscissa of which represents the bit line magnetic field $H_{BL}$, while its ordinate represents the word line magnetic field $H_{WL}$, which respectively arrive at the MRAM cell for its switching. Using the spin-flop phenomenon in an MRAM cell having antiferromagnetically coupled magnetic moment vectors $M_1$ and $M_2$ of the free magnetic region ferromagnetic layers inclined at a 45° angle to the word and bit lines, respectively, a timed switching pulse sequence of applied magnetic fields in a typical "toggling write" mode is at follows: at a time to neither a word line current nor a bit line current is applied, resulting in a zero magnetic field $H_0$ of both $H_{BL}$ and $H_{WL}$. At a time $t_1$, the word line current is increased to $H_1$ and magnetic moment vectors $M_1$ and $M_2$ begin to rotate either clockwise or counter-clockwise, depending on the direction of the word line current, to align themselves substantially orthogonal to the field direction. At a time $t_2$, the bit line current is switched on. The bit line current is chosen to flow in a certain direction so that both magnetic moment vectors $M_1$ and $M_2$ are further rotated in the same clockwise or counter-clockwise direction as the rotation caused by the word line magnetic field. At this time $t_2$, both the word and bit line currents are on, resulting in magnetic field $H_2$ with magnetic moment vectors $M_1$ and $M_2$ being substantially orthogonal to the net magnetic field direction, which is 45° with respect to the current lines. At a time $t_3$, the word line current is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the bit line current is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa, depending on the state switching ("toggling") starts off with.

In order to successfully switch the MRAM cell, it is essential that magnetic field sequence applied thereon results in a magnetic field path crossing diagonal line and circling around a critical magnetic field value ("toggling point") T for initiating toggle switching, since only in that case magnetic moment vectors $M_1$ and $M_2$ are rotated past their hard axis instability points. Otherwise, magnetic fields applied on the MRAM cells must not arrive at another critical magnetic field value ("saturation point") S illustrated in FIG. 1, at which both magnetic moment vectors $M_1$ and $M_2$ of antiferromagnetically coupled ferromagnetic layers of the free magnetic region are forced to align with the applied external magnetic field(s) in a parallel configuration. The cut in the first quadrant in FIG. 1 leads to rectangular "astroids" with a large switching margin. In principle, the toggle field and the activation energy can be adjusted independently in this concept.

However, there are several problems to be addressed in scaling down such MRAM cells, which is one of the most important issues for low-cost and high-density MRAM devices, especially in light of modern portable equipment, such as portable computers, digital still cameras and the like. Down-scaling such MRAM cells requires smaller and smaller magnetic tunnel junctions, which is problematic, since for a given aspect ratio and free layer (or region) thickness the activation energy being dependent on the free layer (or region) volume scales down in proportion to $w^2$, where w is the width of the magnetic cell. Otherwise, the switching fields increase roughly in proportion to $1/\sqrt{w}$. Thus, scaling down MRAM cells, field selected switching becomes ever harder, but at the same time the magnetic cell looses its information more and more rapidly due to thermal activation. For instance, a major problem with having a small activation energy (energy barrier) is that it becomes extremely difficult to selectively switch one MRAM cell in an array, where selectability is seen to allow switching without inadvertently switching other MRAM cells. Further, a rather strong coupling of the antiferromagnetically coupled layers is required to reduce the dipole coupling.

In order to solve the above problems, it has been proposed to add another ferromagnetic layer to the stack of MTJ layers to provide for a static magnetic offset field that shifts rectangular astroid in the stability diagram of FIG. 1 in such a way that the toggling point T approaches the origin of coordinates representing a zero magnetic field of both bit and word lines.

Referring to FIG. 2, the effect of an additional static magnetic offset field is illustrated. As can be seen, providing a further magnetic offset field results in a shift of rectangular astroid 1 (solid line) to rectangular astroid 2 (dotted line), and, hence, toggling point $T_1$ is shifted to toggling point $T_2$, which is closer to the diagram axes crossing point. Accordingly, circling around toggling point $T_2$ for switching of the memory cell can be effected by reduced magnetic switching fields $H_0$, $H_1$, $H_2$, $H_3$ as compared to the case without application of a static magnetic offset field shown in FIG. 1.

However, adding of a ferromagnetic offset layer which creates a permanent static magnetic offset field for shifting the toggling point has the drawback that such additional ferromagnetic layer reduces permanently the activation energy for switching of the MRAM cell. Aggravating this problem, this effect adds to the activation energy reduction the MRAM cell is already suffering due to its down-scaling. For that reason, inadvertent switching of MRAM cells due to thermal fluctuations is more likely to occur, which for adiabatic rotational switching is most critical in the idle state, i.e., in the state where the chip stands-by without being operated (in contrast to Stoner-Wohlfahrt-switching of conventional MRAM cells, where the most critical events are the half-select events).

In light of the above, it would be desirable to provide an MRAM chip allowing a memory cell size down-scale without thereby causing severe problems as to an increase of switching-fields and decrease of activation energy. It would also be desirable to provide a method of writing to the memory chip.

SUMMARY

According to a first aspect of the invention, an MRAM chip is provided which comprises a plurality of magnetoresistive memory cells. Each one of the memory cells includes a magnetic tunnel junction and first and second current lines, which are typically and preferably crossing at right angles, while each magnetoresistive memory element typically is positioned at an intersection thereof. It, however, is not essential that the memory cell is placed at an intersection thereof, it rather is sufficient that the magnetic tunnel junction is at least magnetically coupled to the first and second current lines. The magnetoresistive tunnel junction (MTJ) includes first and a second magnetic regions made of magnetic material stacked in a parallel, overlying relationship and separated by a layer of nonmagnetic material, i.e., arranged on both sides thereof. In a typical configuration, the second magnetic region is provided with a magnetically fixed (pinned) magnetization or magnetic moment vector, while the first magnetic region is provided with a "free" magnetization or magnetic moment vector, which is free to be switched between the same and opposite directions with respect to the fixed magnetization direction of the second magnetic region. Both magnetic regions are magnetically anisotropic having their magnetic anisotropy axes preferably aligned in a parallel configuration. The free magnetic moment vector of the first magnetic region is magnetically coupled to the first and second current lines for its switching between two directions aligned with the magnetic anistropy axis of the free magnetic region. Further, in the magnetoresistive memory cells of the invention, the free magnetic region comprises at least two ferromagnetic layers being antiferromagnetically coupled, where a tri-layered structure including two ferromagnetic layers being antiferromagnetically coupled by an intermediate layer made of antiferromagnetic coupling material is preferred.

According to a characteristic feature of the invention, the memory chip is surrounded by a coil for creating a magnetic offset field which is coupled to the free magnetic moment vector of the second magnetic region. Provision of a coil surrounding the memory chip allows for creating a magnetic offset field in a preferred direction such that at least one of the switching fields of the memory cells is reduced. In other words, if adiabatic rotational switching which is preferred in the present invention is used for switching of the memory cells, creating a magnetic offset field in above preferred direction advantageously allows for a shift of the toggling point of the rectangular astroid in the stability diagram towards the origin of coordinates or, alternatively, towards at least one of the coordinates axes, resulting in a decrease of at least one of the magnetic switching fields to circle around the toggling point.

Polarity (direction) of the magnetic offset field which results in a (temporary) decrease of at least one of the switching fields is dependent on the actual configuration of the memory cells and on which quadrant is used for adiabatic rotational switching. Reducing of at least one of the switching fields of memory cells by the magnetic offset field may be identified by bringing the memory cells in an "active or activated state", while in an "passive or passivated state" of the memory cells no magnetic offset field is applied. Accordingly, a favoring of switching of memory cells between their logic states can be achieved, and, as an particular advantage, passive memory cells are practically immune to inadvertent switching by magnetic stray fields arriving from neighboring memory cells as is likely to occur in the conventional case. Hence, with increased activation energy there is less of a risk for unintended magnetization reversal in the storage case. However, care has to be taken that the magnetic offset field is sufficiently small without running into the saturated state of the MTJs having aligned magnetic moment vectors of the antiferromagnetically coupled ferromagnetic layers.

In the memory chip of the invention, it is highly preferred that the coil is integrated in the chip package. Integrated in the chip package or not, a coil axis of the coil may preferably be inclined in an angle of 45° with respect to both first and second current lines. Using that arrangement of the coil, a reduction of magnetic fields of both first and second current lines can be achieved. Alternatively, a coil axis of the coil may preferably be aligned with the first current line or second current line. Using that arrangements of the coil, a reduction of the magnetic field of the second current line in the former case, and of the magnetic field of the first current line in the latter case can be achieved.

According to a further aspect of the invention, a method of writing into an MRAM-chip is given, which comprises: providing an MRAM chip (e.g., as above described); turning on a first current flowing through the coil to create a magnetic offset field in a preferred direction at a time to such that at least one of the switching fields of the free magnetic moment vectors is reduced; causing a second current to flow through at least one of the first and second current lines at a time $t_1$; turning on a third current flowing through at least the other one of the first and second current lines at a time $t_2$; turning off the at least second current at a time $t_3$ and turning off the at least third current at a time $t_4$, wherein $t_0 < t_1 < t_2 < t_3 < t_4$, such that at least one of the free magnetic moment vectors at a time $t_4$ is oriented differently from the initial preferred direction at the time $t_0$; and turning off the first current flowing through the coil.

According to a preferred embodiment of above method of the invention, the first current flowing through the coil is turned on only once the random access memory (RAM) memory chip is in active state and is turned off when the RAM memory chip is to be brought into a passive state or a deep power-down (idle) modus as is known to those skilled in the art. Alternatively, according to another preferred embodiment of the invention, the first current flowing through the coil is turned on each time the RAM memory chip is to be written to and is turned off each time after the RAM memory chip has been written to. In the first embodiment, it thus is possible to permanently activate all memory cells as long as the memory chip is active, whether they are to be written or not. In the second embodiment, the memory cells are only activated in case they are written to and otherwise the memory cells stay in their passivated states. In the first embodiment, since the first current is caused to permanently flow through the coil, access time to the MRAM chip is lowered; however, its power consumption is enlarged. In the second embodiment, since each time when writing to the memory cells is to be performed the first current flowing through the coil has to be turned on, access time to the MRAM chip is enlarged; however, its power consumption is lowered. In the practical use of the invention, selecting appropriate activation times of the memory cells, for instance, comprising several writing operations, a suitable trade-off between access time and power consumption may be achieved.

BRIEF DESCRIPTION OF THE DRAWINGS

Other and further objects, features and advantages of the invention will appear more fully from the following description. The accompanying drawings, which are incorporated in and constitute a part of the specification, illustrate a presently preferred embodiment of the invention, and together with the general description given above and the detailed description given below, serve to explain the principles of the invention.

DETAILED DESCRIPTION

Figure 3:
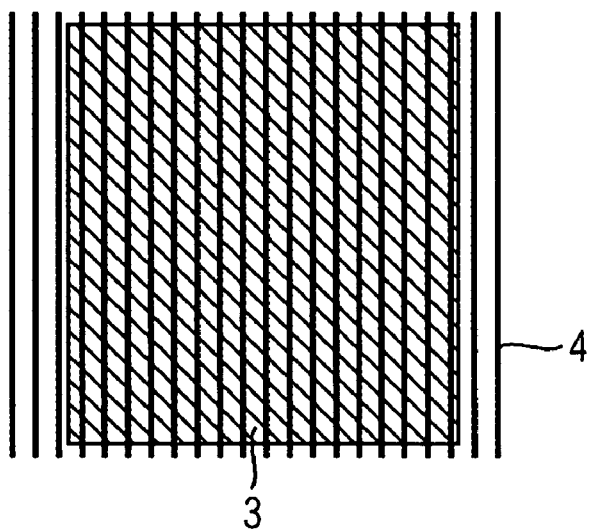
FIG. 3 illustrates an exemplary embodiment of an MRAM chip of the invention with a top-down view of the coil.

An embodiment of the present invention will be described in detail below with reference to the accompanying drawings, where like designations denote like elements. Referring to FIG. 3, an embodiment of the memory chip of the invention is explained.

Based on a conventional MRAM chip 3 comprising a plurality of memory cells (not shown in FIG. 3) with first and second current lines (not shown in FIG. 3) along (write) word lines (WWL) and bit lines (BL), respectively, each one of the magnetoresistive memory cells includes a magnetic tunnel junction (MTJ) which has a magnetic free region and a magnetic reference region made of magnetic materials stacked in a parallel, overlying relationship and separated by a layer of nonmagnetic material. The (net) magnetic moment vector of the free magnetic region of each memory cell is magnetically coupled to a first current line identified as bit line (BL) above the MTJ and a second current line identified as write word line (WWL) below the MTJ for its switching in a parallel or antiparallel state with respect to the magnetic moment vector (magnetization) of the reference region. The easy axis of the MTJ in this embodiment is assumed to be inclined at an angle of 45° with respect to both bit and word lines. Magnetic anisotropy axes of both the magnetic free region and the magnetic reference region are in a parallel configuration, resulting in a common easy axis of MTJ. The magnetic free region is assumed to be a tri-layered structure comprising two ferromagnetic layers having free magnetic moment vectors which are antiferromagnetically coupled by an intermediate layer made of antiferromagnetic coupling material. Free magnetic moment vectors may be balanced or imbalanced. In the former case, a net magnetic moment vector arises in case an external magnetic field is applied.

According to the invention, a coil 4 surrounds the MRAM chip 3 to create a magnetic offset field acting upon the MRAM chip to reduce at least one of the switching fields of the memory cells by creating a magnetic offset field the direction of which depends on the polarity of the current pulses applied to the coil 4. Dependent on the actual configuration of the MRAM chip and which quadrant is used for adiabatic rotational switching, the direction of the magnetic offset field for reducing at least one of the switching fields are determined.

In FIG. 3, coil 4 is in parallel alignment with write word lines so that magnetic switching fields of bit lines are reduced by the magnetic offset field of coil 4.

Figure 4:
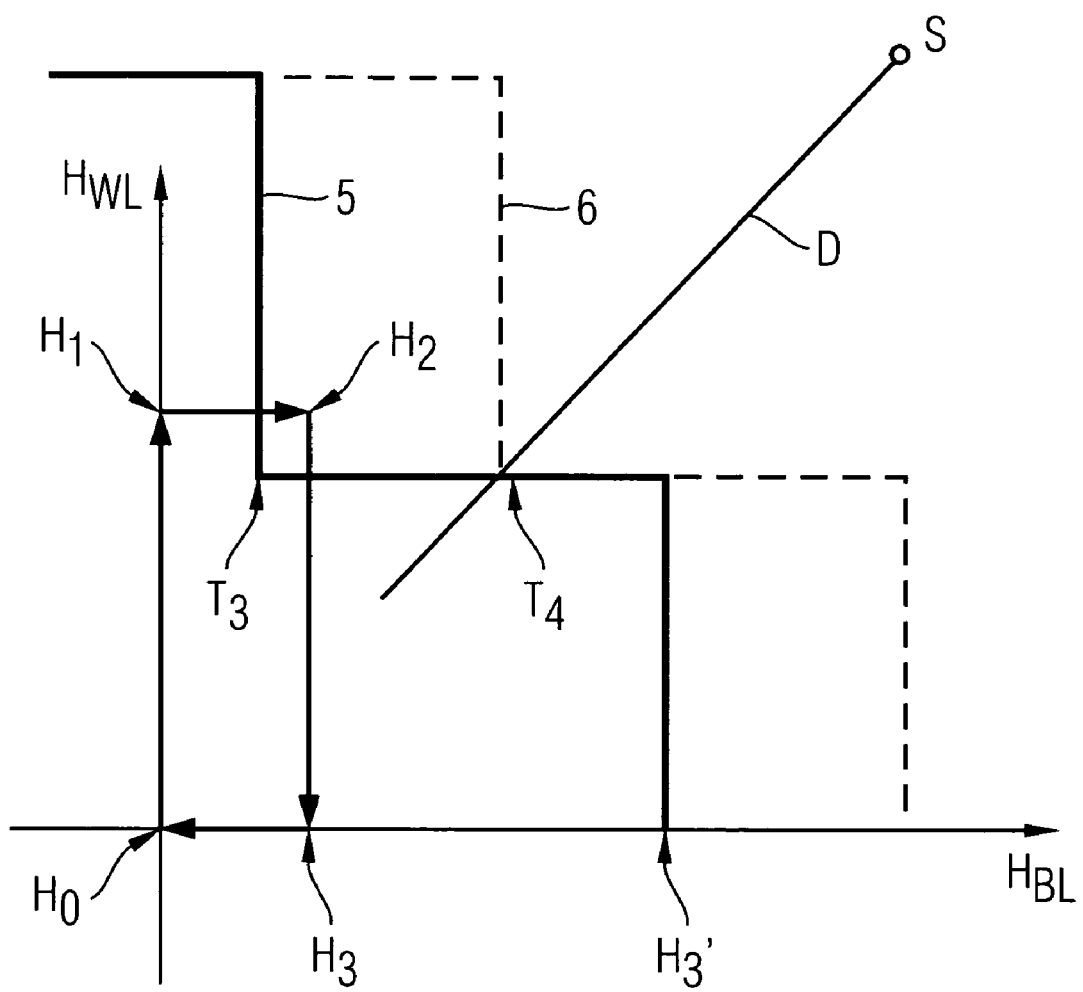
FIG. 4 is an exemplary stability diagram of the MRAM-chip of FIG. 3 illustrating shifting of the toggle point in the active and passive states of the memory cells.

Now referring to FIG. 4, an exemplary stability diagram of the MRAM chip of FIG. 3 is given, in which shifting of the toggling point T into the active and passive states of the memory cells is illustrated.

Figure 1:
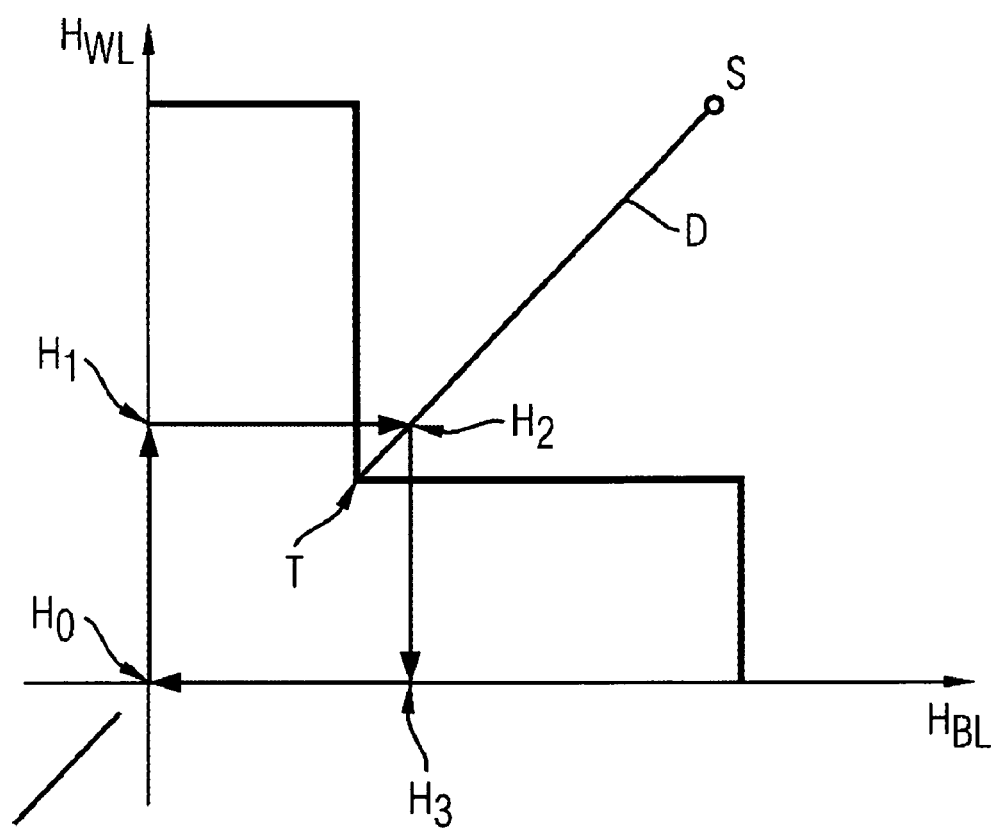
FIG. 1 is an exemplary typical stability diagram of a prior art memory cell comprising a free magnetic region including antiferromagnetically coupled ferromagnetic layers, in which toggle switching is illustrated.
Figure 2:
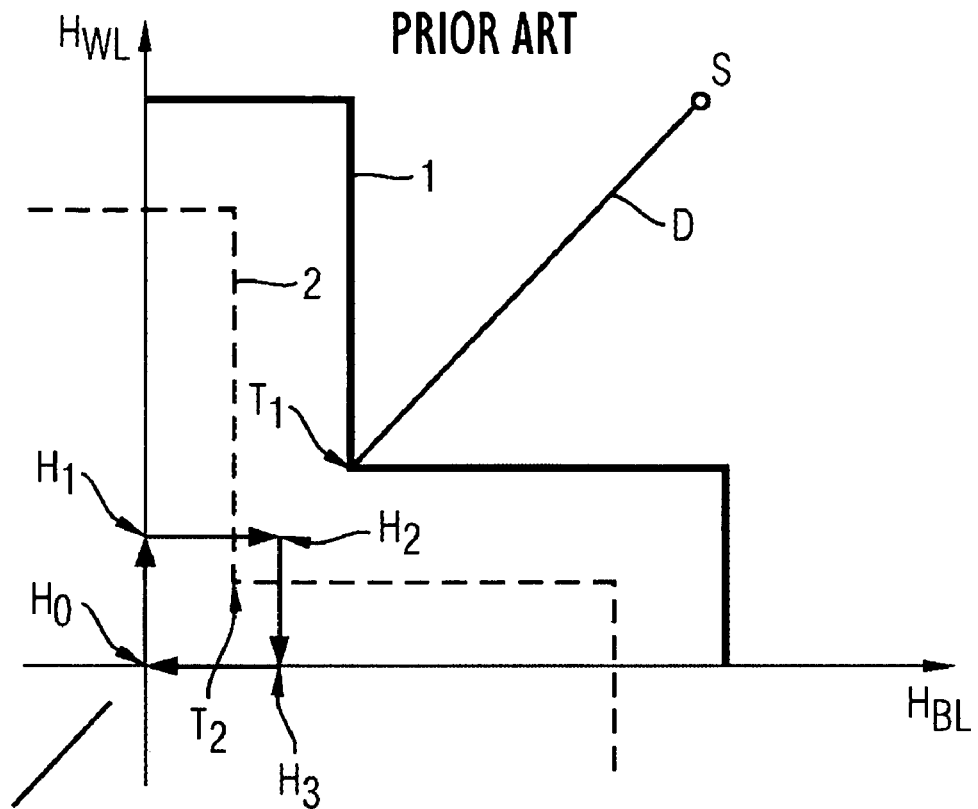
FIG. 2 shows the stability diagram of FIG. 1 illustrating shifting the toggling point towards the origin of coordinates by application of a static magnetic offset field in easy axis direction.

Starting from a typical rectangular astroid 1 having toggling point $T_4$ without applying any magnetic offset field as shown in FIGS. 1 and 2 (not shown in FIG. 4), that is to say a state in which the current flowing through the coil is turned off, a first current is caused to flow through the coil 4 having a predetermined polarity to create a magnetic offset field resulting in rectangular astroid 5 having toggling point $T_3$ to be circled around for switching of the memory cells. As a result, a decrease of the bit line magnetic switching field $H_3$ as compared to the case without having a magnetic offset field is achieved. Accordingly, the memory cells have been brought into their active states. Turning-off the current flowing through coil 4 results in a shift of rectangular astroid 5 back to original rectangular astroid 6 having toggling point $T_4$. Accordingly, the memory cells have been brought into their passive states.

As can be seen from the foregoing, according to the invention, in the new concept particularly useful for scaling-down an MRAM chip comprising magnetoresistive memory cells, a magnetic offset field for reducing at least one of the magnetic switching fields of the memory cells can be applied before writing to the MRAM chip. Application of the magnetic offset field is effected using a coil surrounding the MRAM chip. In other words, the magnetoresistive memory cells of the MRAM chip can be brought into an active state favoring writing to it, and alternatively into a passive state disfavoring writing to it and favoring keeping the logic information stored therein. In the passive state, the memory cells are practically immune against any inadvertent switching caused by magnetic stray fields of neighboring memory cells.

Obviously many modifications and variations of the present invention are possible in light of the above description. It is therefore to be understood, that within the scope of appended claims, the invention may be practiced otherwise than as specifically devised.

REFERENCE LIST

1 Rectangular asteroid without magnetic offset field
2 Rectangular asteroid with magnetic offset field
3 MRAM-chip
4 coil
5 Rectangular asteroid with magnetic offset field from coil
6 Rectangular asteroid with magnetic offset field from coil

What is claimed is:

1. A method of writing to a random access memory (RAM) memory chip, comprising:
   providing a RAM memory chip comprising a plurality of magnetoresistive memory cells each including a magnetic tunnel junction having first and second magnetic regions made of magnetic material provided with magnetic anisotropy and being stacked in a parallel, overlying relationship separated by a layer of non-magnetic material, wherein the first magnetic region is provided with a fixed magnetic moment vector, while the second magnetic region comprises at least two ferromagnetic layers being antiferromagnetically coupled and being provided with a free magnetic moment vector which is switchable between the same and opposite directions with respect to the fixed magnetic moment vector of the first magnetic region, wherein the free magnetic moment vector is magnetically coupled to the magnetic fields of first and second current lines, and wherein the memory chip is surrounded by a coil for creating a magnetic offset field coupled to the free magnetic moment vector of the second magnetic region;
   turning-on a first current flowing through the coil to create a magnetic offset field in a preferred direction at a time to such that at least one switching field of the free magnetic moment vectors is reduced;
   turning-on a second current flowing through at least one of the first and second current lines at a time $t_1$;
   turning-on a third current flowing through at least the other one of the first and second current lines at a time $t_2$;
   turning-off the second current at a time $t_3$ and turning-off the third current at a time $t_4$, wherein $t_0<t_1<t_2<t_3<t_4$, such that at least one of the free magnetic moment vectors at a time $t_4$ is oriented differently from an initial preferred direction at time $t_0$; and
   turning-off the first current to the coil.

2. The method as claimed in claim 1, wherein the first current flowing through the coil is turned on once the RAM memory chip is in an active state and is turned off when the RAM memory chip is to be brought into a passive state.

3. The method as claimed in claim 1, wherein the first current flowing through the coil is turned on each time the RAM memory chip is to be written to and is turned off each time after the RAM memory chip has been written to.

4. The method as claimed in claim 1, wherein the first current flowing through the coil is turned on when the RAM memory chip is to be written to and is turned off after the RAM memory chip has been written to several times.

\* \* \* \* \*

UNITED STATES PATENT AND TRADEMARK OFFICE
CERTIFICATE OF CORRECTION

PATENT NO. : 7,200,033 B2 Page 1 of 1
APPLICATION NO. : 10/998808
DATED : April 3, 2007
INVENTOR(S) : Daniel Braun et al.

It is certified that error appears in the above-identified patent and that said Letters Patent is hereby corrected as shown below:

Col. 2, l. 67: "to" should read --$t_0$--

Col. 5, l. 60: "to" should read --$t_0$--

Col. 8, l. 39: "to" should read --$t_0$--

Signed and Sealed this

Twentieth Day of May, 2008

JON W. DUDAS
*Director of the United States Patent and Trademark Office*